(12) United States Patent
Zhuang et al.

(10) Patent No.: US 10,826,464 B2
(45) Date of Patent: Nov. 3, 2020

(54) SIGNAL PROCESSING METHOD AND APPARATUS

(71) Applicant: Huawei Technologies Co., Ltd., Shenzhen (CN)

(72) Inventors: Liang Zhuang, Shanghai (CN); Ganghua Yang, Boulogne Billancourt (FR); Wenliang Liang, Shanghai (CN)

(73) Assignee: Huawei Technologies Co., Ltd., Shenzhen (CN)

(*) Notice: Subject to any disclaimer, the term of this patent is extended or adjusted under 35 U.S.C. 154(b) by 251 days.

(21) Appl. No.: 15/650,619

(22) Filed: Jul. 14, 2017

(65) Prior Publication Data

US 2017/0317663 A1 Nov. 2, 2017

Related U.S. Application Data

(63) Continuation of application No. PCT/CN2015/078526, filed on May 8, 2015.

(51) Int. Cl.
*H03H 17/02* (2006.01)
*G06F 17/14* (2006.01)

(52) U.S. Cl.
CPC ......... *H03H 17/0213* (2013.01); *G06F 17/14* (2013.01); *G06F 17/142* (2013.01);
(Continued)

(58) Field of Classification Search
CPC ....... H03H 17/0213; H03H 2017/0241; H03H 7/0161; H03H 19/00–002; G06F 17/14; G06F 17/142
See application file for complete search history.

(56) References Cited

U.S. PATENT DOCUMENTS 6,947,509 B1  9/2005  Wong
9,319,791 B2 * 4/2016  Kerner ..................... H04R 3/04
(Continued)

FOREIGN PATENT DOCUMENTS

CN    1549472 A    11/2004
CN    1881974 A    12/2006
(Continued)

OTHER PUBLICATIONS

D. Falconer, S.L. Ariyavisitakul, A. Benyamin-Seeyar, and B. Eidson, "Frequency domain equalization for single-carrier broadband wireless systems," IEEE Commun. Mag., vol. 40, No. 4, pp. 58-66, Apr. 2002 (Year: 2002).*

(Continued)

*Primary Examiner* — Matthew D Sandifer
(74) *Attorney, Agent, or Firm* — Slater Matsil, LLP

(57) ABSTRACT

Embodiments of the present invention provide a signal processing method and apparatus. The method includes: performing M-way filtering on an input signal to obtain M filtered signals, performing extraction on M filtered signals separately to obtain M extracted signals, performing fast Fourier transform (FFT) on the M extracted signals separately to obtain M frequency-domain signals, and finally determining output signals according to the M frequency-domain signals. According to the embodiments of the present invention, signal filtering and extraction are performed and then FFT is performed.

9 Claims, 10 Drawing Sheets

(52) U.S. Cl.
CPC ....... *G06F 17/147* (2013.01); *H03H 17/0202* (2013.01); *H03H 2017/0214* (2013.01)

(56) References Cited

U.S. PATENT DOCUMENTS

| | | | |
|---|---|---|---|
| 2006/0285602 A1 | 12/2006 | Lim | |
| 2007/0232257 A1 | 10/2007 | Otani et al. | |
| 2010/0150365 A1* | 6/2010 | Fujimaki | H03H 17/0266 381/71.1 |
| 2012/0219085 A1* | 8/2012 | Long | H04L 25/14 375/295 |
| 2012/0269234 A1* | 10/2012 | Zhang | H04L 5/0007 375/143 |
| 2014/0169501 A1* | 6/2014 | Nazarathy | H03H 17/0266 375/316 |
| 2014/0226762 A1 | 8/2014 | Maltsev et al. | |

FOREIGN PATENT DOCUMENTS

| | | |
|---|---|---|
| CN | 1897111 A | 1/2007 |
| CN | 1902870 A | 1/2007 |
| CN | 101027719 B | 8/2007 |
| CN | 101090386 A | 12/2007 |
| CN | 101478525 A | 7/2009 |
| CN | 101582059 A | 11/2009 |
| CN | 102799564 A | 11/2012 |

OTHER PUBLICATIONS

F. Pancaldi, G. Vitetta, R. Kalbasi, N. Al Dhahir, M. Uysal, and H. Mheidat, "Single-carrier frequency domain equalization", IEEE Signal Process. Mag., vol. 25, No. 5, pp. 37-56, Sep. 2008 (Year: 2008).*

Jones, D.L, "Decimation-in-Frequency (DIF) Radix-2 FFT," OpenStax-CNX Module: m12018, Sep. 17, 2006, 6 pages.

* cited by examiner

SIGNAL PROCESSING METHOD AND APPARATUS

CROSS-REFERENCE TO RELATED APPLICATIONS

This application is a continuation of International Application No. PCT/CN2015/078526, filed on May 8, 2015, the disclosure of which is hereby incorporated by reference in its entirety.

TECHNICAL FIELD

Embodiments of the present invention relate to the communications field, and more specifically, to a signal processing method and apparatus.

BACKGROUND

In a signal processing system, people widely use fast Fourier transform (FFT) and inverse fast Fourier transform (IFFT) to implement signal conversion between a time domain and a frequency domain. For example, the FFT and the IFFT need to be used in a single-carrier system to implement frequency domain equalization.

Computation amounts of the FFT and the IFFT are related to a quantity of sampling points for the FFT and the IFFT. For example, in direct FFT transform, a quantity of additions is approximately $N \log_2 N$, and a quantity of multiplications is approximately $$\frac{1}{2} N \log_2 N,$$

where N is a quantity of sampling points. Currently, a quantity of sampling points for FFT is relatively small in a commonly used communications protocol. For a single-carrier frequency domain equalization (SC-FDE) system with only 2048 sampling points, real-time computing pressure of the FFT or the IFFT is relatively low. However, with application of broadband technologies, a quantity of signal sampling points increases, the computation amounts of the FFT and the IFFT increase, and computation complexity increases. This brings a difficulty to real-time processing. For a same quantity N of sampling points, how to quickly implement FFT and IFFT and reduce computation complexity of the FFT and the IFFT is a problem to be urgently resolved in a bandwidth communications system.

SUMMARY

Embodiments of the present invention provide a signal processing method and apparatus, so as to reduce computation complexity.

According to a first aspect, a signal processing method is provided. The method includes performing M-way filtering on an input signal to decompose the input signal into M filtered signals, where the input signal is a time-domain signal with N sampling points, frequency bands of the M filtered signals do not overlap with each other, M is an integer greater than or equal to 2, and N is a positive integer. The method also includes performing extraction on the M filtered signals separately to obtain M extracted signals, where a sum of sampling points of the M extracted signals is N. The method also includes performing fast Fourier transform (FFT) on the M extracted signals separately to obtain M frequency-domain signals; and determining output signals according to the M frequency-domain signals.

According to a second aspect, a signal processing method is provided. The method includes decomposing an input signal to obtain M decomposed signals, where frequency bands of the M decomposed signals do not overlap with each other, the input signal is a frequency-domain signal with N sampling points, a sum of sampling points of the M decomposed signals is N, M is an integer greater than or equal to 2, and N is a positive integer. The method also includes performing inverse fast Fourier transform (IFFT) on the M decomposed signals separately to obtain M time-domain signals. The method also includes performing interpolation on the M time-domain signals separately to obtain M interpolated signals, where a quantity of sampling points of each interpolated signal is N. The method also includes filtering the M interpolated signals separately to obtain M filtered signals; and determining output signals according to the M filtered signals.

According to a third aspect, a signal processing method is provided. The method includes performing M-way first filtering on an input signal to decompose the input signal into M first filtered signals, where the input signal is a time-domain signal with N sampling points, frequency bands of the M first filtered signals do not overlap with each other, M is an integer greater than or equal to 2, and N is a positive integer. The method also includes performing extraction on the M first filtered signals separately to obtain M extracted signals, where a sum of sampling points of the M extracted signals is N. The method also includes performing fast Fourier transform (FFT) on the M extracted signals separately to obtain M frequency-domain signals; and performing frequency-domain processing on the M frequency-domain signals separately to obtain M frequency-domain processed signals.

According to a fourth aspect, a signal processing apparatus is provided. The apparatus includes a filtering unit, where the filtering unit includes M filters, the M filters are configured to respectively filter an input signal to obtain M filtered signals, the input signal is a time-domain signal with N sampling points, frequency bands of the M filtered signals do not overlap with each other, M is an integer greater than or equal to 2, and N is a positive integer. The apparatus also includes an extraction unit, where the extraction unit includes M extractors, the M extractors are connected to the M filters in a one-to-one correspondence, the M extractors are configured to respectively extract the M filtered signals obtained by the filtering unit to obtain M extracted signals, and a sum of sampling points of the M extracted signals is N. The apparatus also includes a fast Fourier transform (FFT) unit, where the FFT unit includes M FFT transformers, the M FFT transformers are connected to the M extractors in a one-to-one correspondence, and the M FFT transformers are configured to perform fast Fourier transform (FFT) respectively on the M extracted signals obtained by the extraction unit to obtain M frequency-domain signals. The apparatus also includes a determining unit, configured to obtain output signals according to the M frequency-domain signals obtained by the FFT unit.

According to a fifth aspect, a signal processing apparatus is provided. The apparatus includes a decomposition unit, configured to decompose an input signal to obtain M decomposed signals, where frequency bands of the M decomposed signals do not overlap with each other, the input signal is a frequency-domain signal with N sampling points, a sum of sampling points of the M decomposed signals is N, M is an integer greater than or equal to 2, and N is a positive integer.

The apparatus also includes an inverse fast Fourier transform (IFFT) unit, where the IFFT unit includes M IFFT transformers, the M decomposed signals are respectively input into the M IFFT transformers in a one-to-one correspondence, and the M IFFT transformers are configured to perform inverse fast Fourier transform (IFFT) respectively on the M decomposed signals obtained by the decomposition unit to obtain M time-domain signals. The apparatus also includes an interpolation unit, where the interpolation unit includes M interpolators, the M interpolators are connected to the M IFFT transformers in a one-to-one correspondence, the M interpolators are configured to perform interpolation respectively on the M time-domain signals obtained by the IFFT unit to obtain M interpolated signals, and a quantity of sampling points of each interpolated signal is N; a filtering unit, where the filtering unit includes M filters, the M filters are connected to the M interpolators in a one-to-one correspondence, and the M filters are configured to respectively filter the M interpolated signals obtained by the interpolation unit to obtain M filtered signals. The apparatus also includes a determining unit, configured to determine output signals according to the M filtered signals obtained by the filtering unit.

According to a sixth aspect, a signal processing apparatus is provided. The apparatus also includes a first filtering unit, where the first filtering unit includes M first filters, the M first filters are configured to perform M-way first filtering on an input signal to decompose the input signal into M first filtered signals, the input signal is a time-domain signal with N sampling points, frequency bands of the M first filtered signals do not overlap with each other, M is an integer greater than or equal to 2, and N is a positive integer. The apparatus also includes an extraction unit, where the extraction unit includes M extractors, the M extractors are connected to the M first filters in a one-to-one correspondence, the M extractors are configured to perform extraction on the M first filtered signals respectively to obtain M extracted signals, and a sum of sampling points of the M extracted signals is N. The apparatus also includes a fast Fourier transform (FFT) unit, where the FFT unit includes M FFT transformers, the M FFT transformers are connected to the M extractors in a one-to-one correspondence, and the M FFT transformers are configured to perform fast Fourier transform (FFT) on the M extracted signals respectively to obtain M frequency-domain signals. The apparatus also includes a frequency-domain equalization unit, where the frequency-domain equalization unit includes M frequency-domain equalizers, the M frequency-domain equalizers are connected to the M FFT transformers in a one-to-one correspondence, and the M frequency-domain equalizers are configured to perform frequency-domain processing on the M frequency-domain signals respectively to obtain M frequency-domain processed signals.

According to the embodiments of the present invention, M-way filtering is performed on an input signal; extraction is performed on filtered signals obtained after filtering to obtain extracted signals, so that a sum of sampling points of the M extracted signals is a quantity of sampling points of the input signal; and FFT is performed on the M extracted signals separately. This avoids a problem of a computation complexity increase caused by performing FFT directly on the input signal, and can reduce computation complexity.

BRIEF DESCRIPTION OF THE DRAWINGS

To describe the technical solutions in the embodiments of the present invention more clearly, the following briefly describes the accompanying drawings required for describing the embodiments of the present invention. Apparently, the accompanying drawings in the following description show merely some embodiments of the present invention, and a person of ordinary skill in the art may still derive other drawings from these accompanying drawings without creative efforts.

DETAILED DESCRIPTION OF ILLUSTRATIVE EMBODIMENTS

The following clearly describes the technical solutions in the embodiments of the present invention with reference to the accompanying drawings in the embodiments of the present invention. Apparently, the described embodiments are a part rather than all of the embodiments of the present invention. All other embodiments obtained by a person of ordinary skill in the art based on the embodiments of the present invention without creative efforts shall fall within the protection scope of the present invention.

It should be understood that a specific application scenario is not limited in the embodiments of the present invention. For example, the technical solutions in the embodiments of the present invention may be applied to various communications systems, such as a single-carrier frequency domain equalization system (SC-FDE). The embodiments of the present invention may also be applied to graphics processing. All methods that involve using a method in the present invention to reduce a computation amount of FFT or IFFT or to improve a computation parallelism degree shall fall within the protection scope of the present invention.

Figure 1:
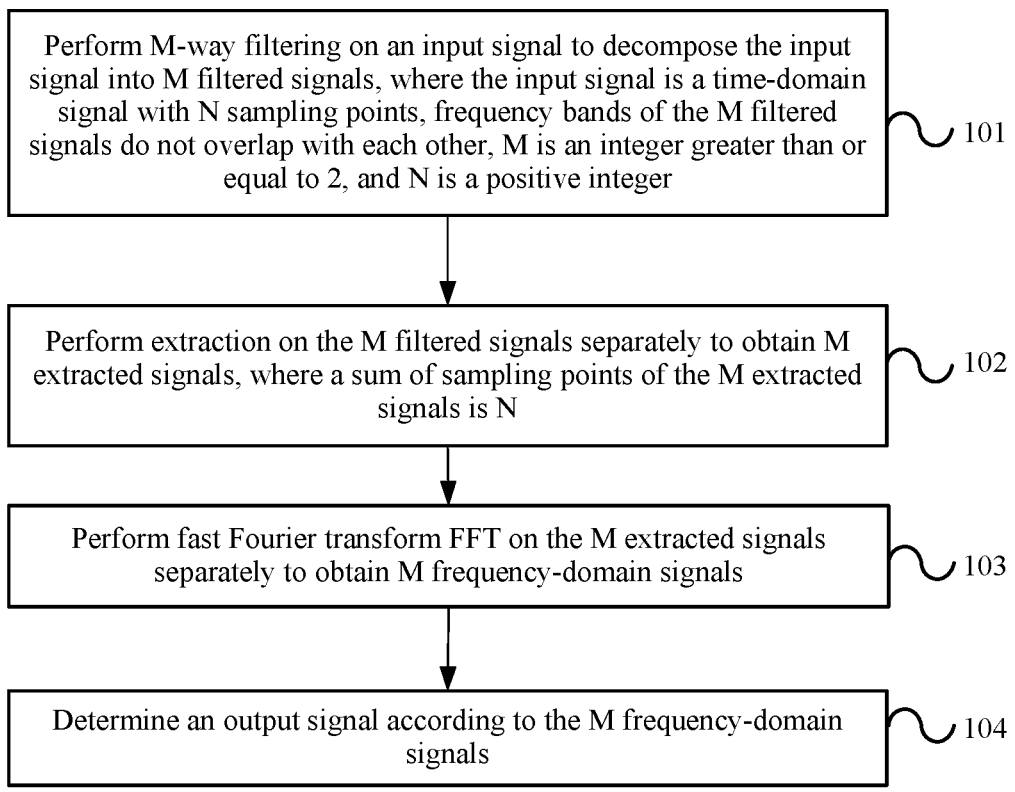
FIG. 1 is a schematic flowchart of a signal processing method according to an embodiment of the present invention.

FIG. 1 is a schematic flowchart of a signal processing method according to an embodiment of the present invention. The method includes the following steps.

101: Perform M-way filtering on an input signal to decompose the input signal into M filtered signals, where the input signal is a time-domain signal with N sampling points, frequency bands of the M filtered signals do not overlap with each other, M is an integer greater than or equal to 2, and N is a positive integer.

102: Perform extraction on the M filtered signals separately to obtain M extracted signals, where a sum of sampling points of the M extracted signals is N.

103: Perform fast Fourier transform (FFT) on the M extracted signals separately to obtain M frequency-domain signals.

104: Determine output signals according to the M frequency-domain signals.

According to this embodiment of the present invention, M-way filtering is performed on an input signal; extraction is performed on filtered signals obtained after filtering to obtain extracted signals, so that a sum of sampling points of the M extracted signals is a quantity of sampling points of the input signal; and FFT is performed on the M extracted signals separately. This avoids a problem of a computation complexity increase caused by performing FFT directly on the input signal, and can reduce computation complexity. Currently, FFT and IFFT are directly used widely for FFT and IFFT computation. Computation amounts of the FFT and the IFFT are related to a quantity of sampling points in FFT and IFFT computation. For example, in direct FFT transform for a signal with N sampling points, a quantity of additions is approximately $N \log_2 N$, and a quantity of multiplications is approximately $$\frac{1}{2} N \log_2 N.$$

In a commonly used communications protocol, a quantity of sampling points in FFT is relatively small, and computation amounts of FFT and IFFT are also light. However, as a system bandwidth increases, a quantity of sampling points of a transmit signal in a system also increases sharply. For example, in a bandwidth system, such as in an SC-FDE system, when a bandwidth increases from 20 Mbit/s to 500 Mbit/s, a quantity of sampling points of a data signal in IFFT computation sharply increases from existing 2048 to 2048*(500/20)=51200. Generally, the quantity of sampling points is integral power of 2. Therefore, 65536 sampling points need to be used actually for implementation. In FFT and IFFT computation, as a quantity of sampling points increases, a quantity of additions increases, and a quantity of multiplications increases, that is, computation complexity increases, and computation overheads are large.

It is assumed that in this embodiment of the present invention, a quantity of sampling points of an input signal is N, where N is a positive integer. Preferably, $N=2^m$, where m is a positive integer.

It should be understood that a quantity of sampling points of each extracted signal is not limited in this embodiment of the present invention. A case in which a signal obtained after extraction can be restored to an original signal by means of IFFT shall fall within the protection scope of the present invention.

Optionally, in an embodiment of the present invention, when the sampling points of the input signal are evenly distributed on M ways, a quantity of sampling points of each extracted signal is N/M. Preferably, $N/M=2^p$, where p is a positive integer. It should be understood that when a quantity of sampling points of a signal is not a power of 2, before FFT is performed, zero filling may be performed on the signal, so that the quantity of the sampling points of the signal is a power of 2.

It should be understood that a frequency bandwidth of each filtered signal is not limited in this embodiment of the present invention. An invention in which a frequency band of the input signal may be decomposed into the frequency bands of the M filtered signals shall fall within the protection scope of the present invention.

Optionally, in an embodiment of the present invention, when the frequency band of the input signal is evenly distributed on M ways, a frequency band of each of the M filtered signals occupies 1/M of the frequency band of the input signal.

Filtering in this embodiment of the present invention may be digital filtering, or may be analog filtering. That is, filtering processing of the input signal may be implemented by means of digital filtering, or filtering processing of the input signal may be implemented by using multiple filters. This is not limited in this embodiment of the present invention. For example, decomposition filtering processing of M signals in a decomposition filtering array may be implemented by using a program or a decomposition filter bank, and filtering processing of different signals is performed by using different amplitudes to remain a signal on a frequency band on a way and filter out a signal on another frequency band. Herein, signal filtering processing may be performed according to an amplitude-frequency characteristic of a filter.

In this embodiment of the present invention, the input signal with N sampling points is input into a decomposition filtering array, and each input signal has a same quantity N of sampling points as the original input signal. Herein, the input signal may be replicated to obtain M replicated signals, and each replicated signal is processed. It should be understood that different ways may be connected by using a bus, so that a signal the same as the original input signal is obtained on each way. The decomposition filtering array may include M filters, and each decomposition filter has a respective amplitude-frequency characteristic.

IFFT or FFT for which there are many points has high computation complexity and large computation overheads. In this embodiment of the present invention, if extraction is performed directly on the signal to obtain M segments of signals, and FFT is performed on the M segments of signals separately, computation complexity can be reduced, but a spectrum aliasing phenomenon is very likely to occur, which causes that a peer end cannot restore a received signal to the original signal. In this embodiment of the present invention, a method is described about how to reduce computation complexity as much as possible and further improve a computation parallelism degree in some application scenarios, while ensuring that spectra are not aliased and the original signal can be restored.

Specifically, filtering processing may be performed on the M input signals in the decomposition filtering array to obtain all filtered signals. M is an integer greater than or equal to 2. Then, extraction is performed on each filtered signal to obtain each extracted signal. A sum of sampling points of the M extracted signals is N. Then, inverse fast Fourier transform (IFFT) is performed on each extracted signal to obtain each frequency-domain signal. Herein, in filtering processing of a signal, the signal is decomposed into M signals on different frequency bands according to a frequency, and the M segments of signals are respectively processed on M different ways.

It should be understood that, that the frequency bands of the M filtered signals do not overlap with each other in this embodiment of the present invention is not strictly limited, and a case in which the original signal can be basically restored without distortion on the M frequency bands shall fall within the protection scope of the present invention. For example, non-overlapping in this embodiment of the present invention may be mutual orthogonality between the M filters.

Optionally, in an embodiment of the present invention, M times extraction may be performed on each filtered signal to obtain an extracted signal. A quantity of sampling points of each extracted signal is N/M. In M times extraction, one sampling point may be sequentially extracted from every M sampling points as a new sampling point of an extracted signal. In this way, a quantity of sampling points of each signal is changed to 1/M of a quantity of sampling points of the original signal, that is, a long-sequence signal may be decomposed into multiple short-sequence signals, and FFT is performed on the short-sequence signals.

In an embodiment of the present invention, fast Fourier transform (FFT) may be performed on each extracted signal to obtain each frequency-domain signal. In this way, FFT of a long-sequence signal is decomposed into FFT of several short-sequence signals. This can reduce computation complexity. For example, a signal transmit bandwidth is 40 Mbit/s, and a signal with 4096 sampling points may be decomposed into two signals with 2048 sampling points. If one time of FFT transform is performed on the 4096 sampling points, in FFT computation, a quantity of additions is N log$_2$ N=4096*12=49152, and a quantity of multiplications is $$\frac{1}{2} N \log_2 N = 24576.$$

When two times of FFT transform are used to separately process the signals, in FFT computation, a quantity of additions is N log$_2$(N/2)=45056, and a quantity of multiplications is $$\frac{1}{2} N \log_2 (N/2) = 22528.$$

In addition, if a 23-point decomposition filter is used as the decomposition filter, when each 23-point decomposition filter performs decomposition filtering processing on a signal, a quantity of times of performing an addition operation is 22, and a quantity of times of performing a multiplication operation is 23. Therefore, a total quantity of additions in the FFT and the decomposition filtering processing is 45056+ 22*2, which is still less than a quantity 49152 of additions in processing 4096 sampling points by using one time of FFT. Similarly, a total quantity of multiplications in the FFT and the decomposition filtering processing is 22528+23*2, which is still less than a quantity 24576 of multiplications in processing 4096 sampling points by using one time of FFT.

Optionally, in an embodiment of the present invention, before M-way filtering is performed on the input signal, serial-to-parallel conversion may be performed on a to-be-processed signal to obtain parallel to-be-processed signals, and the parallel to-be-processed signals are used as the input signal. Herein, the to-be-processed signals may be received signals, or may be generated signals.

Optionally, in an embodiment of the present invention, after the frequency-domain signals are obtained by means of the FFT, frequency-domain processing may be further performed on the M frequency-domain signals. Preferably, frequency-domain equalization processing is performed on the M frequency-domain signals to obtain M frequency-domain equalization signals. Then, parallel-to-serial conversion is performed on the frequency-domain equalization signals to obtain a serial signal corresponding to the frequency-domain equalization signals, and the serial signal is determined as output signals.

Optionally, in an embodiment of the present invention, after the frequency-domain signals are obtained by means of the FFT, parallel-to-serial conversion may be performed directly on the M frequency-domain signals to obtain a serial signal corresponding to the M frequency-domain signals, and the serial signal is determined as output signals.

In an embodiment of the present invention, the M input signals may be processed separately. Herein, separate processing includes parallel processing or serial processing of all the M signals.

Optionally, in an embodiment of the present invention, the performing M-way filtering on an input signal to decompose the input signal into M filtered signals includes: replicating the input signal to obtain M replicated signals of the input signal, and filtering in series the M replicated signals separately to obtain the M filtered signals.

In serial processing of all the M signals, one processor may be used to process all the signals. For example, one processor is used to perform filtering processing, extraction, and FFT on all the M signals. That is, one processor is used to perform decomposition filtering, extraction, and FFT on each signal.

Optionally, in an embodiment of the present invention, the performing M-way filtering on an input signal to decompose the input signal into M filtered signals includes: replicating the input signal to obtain M replicated signals of the input signal, and filtering in parallel the M replicated signals to obtain the M filtered signals.

In parallel processing of all the M signals, different processors may be used to process different signals. For example, one processor of M processors is used to perform filtering processing, extraction, and FFT on each of the M signals. That is, one processor is used to process one signal. In this way, M processors may be used to process in parallel the M signals.

A specific sequence for processing the M signals is not limited in this embodiment of the present invention. Performing processing on a same type of signals on the M ways may be performing serial processing sequentially on the same type of signals on the M ways; or may be performing parallel processing on the M signals. For example, when a computation capability of a processing platform is limited, performing processing on a same type of signals on the M ways may be performing serial processing sequentially on the M signals. This can reduce computation complexity by using an implementation of the present invention. When a processing platform has a sufficient computation capability, parallel processing may be performed on the M signals. This can reduce computation complexity, and also improve a computation parallelism degree, sharply accelerating processing. Particularly, parallel processing in this embodiment of the present invention is applied to a graphics processing unit (GPU) to implement graphics processing by using single instruction, multiple threads (SIMT), or parallel processing in this embodiment of the present invention is applied to an application-specific integrated circuit (ASIC) or a field-programmable gate array (FPGA). This can greatly improve a processing speed. For example, an FPGA is used to perform 65536-point FFT. After the 65536-point FFT is converted into 32 times of 2048-point FFT, 32 FFT branches may be used for parallel processing, thereby increasing a computation speed by 32 times and shortening a computation time.

When multiple processors are used to process in parallel multiple signals, frequency-domain processing may be performed on the M signals at the same time, or frequency-domain processing may be performed on each signal. When one processor is used to process multiple signals separately, frequency-domain processing may be performed on one signal, or after frequency-domain signals of the multiple signals are obtained, frequency-domain processing may be performed on the multiple signals. This is not limited in this embodiment of the present invention.

Similarly, when multiple processors are used to process in parallel multiple signals, parallel-to-serial conversion may be performed on the M signals at the same time, or parallel-to-serial conversion may be performed on each signal. When one processor is used to process multiple signals separately, parallel-to-serial conversion may be performed on one signal, or after frequency-domain signals of the multiple signals are obtained, parallel-to-serial conversion may be performed on the multiple signals. This is not limited in this embodiment of the present invention.

Figure 2:
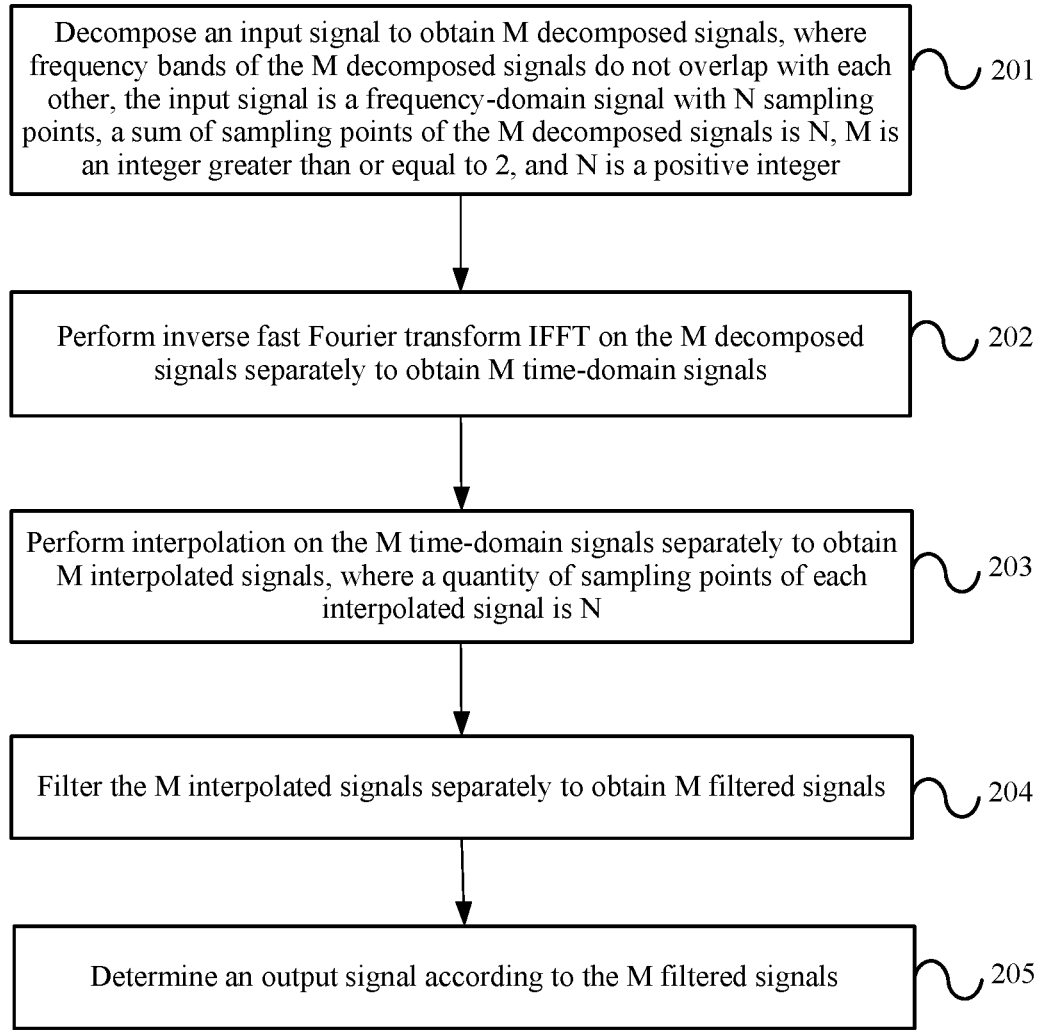
FIG. 2 is a schematic flowchart of a signal processing method according to another embodiment of the present invention.

FIG. 2 is a schematic flowchart of a signal processing method according to another embodiment of the present invention.

201: Decompose an input signal to obtain M decomposed signals, where frequency bands of the M decomposed signals do not overlap with each other, the input signal is a frequency-domain signal with N sampling points, a sum of sampling points of the M decomposed signals is N, M is an integer greater than or equal to 2, and N is a positive integer.

202: Perform inverse fast Fourier transform (IFFT) on the M decomposed signals separately to obtain M time-domain signals.

203: Perform interpolation on the M time-domain signals separately to obtain M interpolated signals, where a quantity of sampling points of each interpolated signal is N.

204: Filter the M interpolated signals separately to obtain M filtered signals.

205: Determine output signals according to the M filtered signals.

According to this embodiment of the present invention, an input signal is decomposed, IFFT is performed separately on decomposed signals obtained after decomposition, interpolation is performed on time-domain signals obtained after the IFFT, and finally signals obtained after interpolation are filtered, and output signals is obtained. In this way, the IFFT is performed on the M decomposed signals separately, avoiding a problem of a computation complexity increase caused by performing IFFT directly on the input signal, and reducing computation complexity.

Currently, FFT and IFFT are directly used widely for FFT and IFFT computation. Computation amounts of the FFT and the IFFT are related to a quantity of sampling points in FFT and IFFT computation. In FFT and IFFT computation, as a quantity of sampling points increases, a quantity of additions increases, and a quantity of multiplications increases, that is, computation complexity increases, and computation overheads are large. How to reduce computation complexity as much as possible when a quantity of sampling points in IFFT computation increases is described in this embodiment of the present invention.

It should be understood that a quantity of sampling points of each decomposed signal is not limited in this embodiment of the present invention. A case in which a decomposed signal obtained after decomposition can be restored to an original signal by means of IFFT shall fall within the protection scope of the present invention. The sum of sampling points of the M decomposed signals is N.

Optionally, in an embodiment of the present invention, when the sampling points of the input signal are evenly distributed on M ways, a quantity of sampling points of each decomposed signal is N/M. Preferably, $N/M=2^p$, where p is a positive integer. It should be understood that when a quantity of sampling points of a signal is not a power of 2, before filtering is performed by means of the IFFT, zero filling may be performed on the signal, so that the quantity of the sampling points of the signal is a power of 2.

It should be understood that a frequency bandwidth of each decomposed signal is not limited in this embodiment of the present invention. An invention in which a frequency band of the input signal may be decomposed into the frequency bands of the M decomposed signals shall fall within the protection scope of the present invention.

Optionally, in an embodiment of the present invention, when the frequency band of the input signal is evenly distributed on M ways, a frequency band of each decomposed signal of the M decomposed signals occupies 1/M of the frequency band of the input signal.

After interpolation processing is performed on the signals, a time domain of each signal is expanded, and a frequency domain of each signal is narrowed, that is, distortion occurs. To eliminate the distortion, filtering processing may be performed on each interpolated signal to eliminate mirroring, to obtain a signal on a frequency band, and then addition is performed to restore an undistorted baseband signal. Filtering in this embodiment of the present invention may be digital filtering, or may be analog filtering. That is, signal filtering processing may be implemented by means of digital filtering, or signal filtering processing may be implemented by using multiple filters. This is not limited in this embodiment of the present invention. For example, filtering processing of each of M signals in a filtering array may be implemented by using a program or a filter bank, and filtering processing of different sequence signals is performed by using different amplitudes to remain a signal on a frequency band and filter out a signal on another frequency band. Herein, signal filtering processing may be performed according to an amplitude-frequency characteristic of a synthesis filter. After interpolation and synthesis filtering processing, an IFFT signal may be restored to the original signal, and computation complexity is also reduced.

In this embodiment of the present invention, inverse fast Fourier transform (IFFT) may be performed on each of M signals in a synthesis filtering array to obtain an IFFT signal. Assuming that a quantity of sampling points of each signal is N/M, $N/M=2^p$, and p is a positive integer, a quantity of sampling points of each interpolated signal is N, $N=2^m$, and m is a positive integer. Then, M times interpolation is performed on each IFFT signal to obtain an interpolated signal. A quantity of sampling points of the interpolated signal obtained after interpolation is N. Interpolation may be: interpolating a value between two sampling points of the original signal. For example, in the M times interpolation, M−1 zeros may be interpolated between every two sampling points of the signal. Then, filtering processing is performed on the interpolated signal to obtain a synthesized filtered signal. After filtering processing, each filtered signal is a signal on a different frequency band. In this way, IFFT is performed on multiple short-sequence signals, and interpolation and filtering are performed on the multiple short-sequence signals, so that the signals can be restored to the original signal. Decomposing IFFT of a long-sequence signal into IFFT of M short-sequence signals can reduce computation complexity.

Optionally, in an embodiment of the present invention, parallel-to-serial conversion may be performed on one filtered signal to obtain a serial signal corresponding to the filtered signal.

In an embodiment of the present invention, after filtering is performed on M interpolated signals, the M filtered signals may be synthesized on a general frequency band to obtain the output signals. Herein, a quantity of sampling points of the output signals is N. Synthesis may be that $Q^{th}$ points of all of the M signals are accumulated to obtain the $Q^{th}$ point of a synthesized filtered signal, where Q is a positive integer.

It should be understood that the signal in this embodiment of the present invention may be a video, an audio, data, graphics, or the like. This is not limited in the present invention.

It should be understood that, that the frequency bands of the M filtered signals do not overlap with each other in this embodiment of the present invention is not strictly limited, and a case in which the original signal can be basically restored without distortion on the M frequency bands shall fall within the protection scope of the present invention. For example, non-overlapping in this embodiment of the present invention may be mutual orthogonality between M filters.

In an embodiment of the present invention, the M decomposed signals may be processed separately. Herein, separate processing includes parallel processing or serial processing of all the M signals.

Optionally, in an embodiment of the present invention, the performing inverse fast Fourier transform (IFFT) on the M decomposed signals separately to obtain M time-domain signals includes: performing in series the inverse fast Fourier transform (IFFT) on the M decomposed signals to obtain the M time-domain signals.

In serial processing of all the M signals, one processor may be used to process all the signals. For example, one processor is used to perform IFFT, interpolation, and filtering processing on all the M signals. That is, one processor is used to perform IFFT, interpolation, and filtering processing separately on each of the M signals.

Optionally, in an embodiment of the present invention, the performing inverse fast Fourier transform (IFFT) on the M decomposed signals separately to obtain M time-domain signals includes: performing in parallel the inverse fast Fourier transform (IFFT) on the M decomposed signals to obtain the M time-domain signals. In this way, a long-sequence signal is decomposed into several short-sequence signals for performing IFFT. This can reduce computation complexity.

In parallel processing of all the M signals, different processors may be used to process different signals. For example, one processor of M processors is used to perform IFFT, interpolation, and filtering separately on each of the M signals. That is, each signal is processed by using one processor. In this way, the M processors may be used for parallel processing of the M signals. This can reduce computation complexity and improve a computation parallelism degree.

A specific sequence for processing the M signals is not limited in this embodiment of the present invention. Performing processing on a same type of signals on the M ways may be performing serial processing sequentially on the same type of signals on the M ways; or may be performing parallel processing on the M signals. For example, when a computation capability of a processing platform is limited, performing processing on a same type of signals on the M ways may be performing serial processing sequentially on the M signals. This can reduce computation complexity. When a processing platform has a sufficient computation capability, parallel processing may be performed on the M signals. This can reduce computation complexity, and also improve a computation parallelism degree, sharply accelerating processing. Particularly, parallel processing in this embodiment of the present invention is applied to a graphics processing unit (GPU) to implement graphics processing by using single instruction, multiple threads (SIMT), or parallel processing in this embodiment of the present invention is applied to an application-specific integrated circuit (ASIC) or a field-programmable gate array (FPGA). This can greatly improve a processing speed.

When multiple processors are used to process in parallel multiple signals, frequency-domain processing may be performed on the M signals at the same time, or frequency-domain processing may be performed on each signal. When one processor is used to process multiple signals separately, frequency-domain processing may be performed on one signal, or after frequency-domain signals of the multiple signals are obtained, frequency-domain processing may be performed on the multiple signals. This is not limited in this embodiment of the present invention.

Similarly, when multiple processors are used to process in parallel multiple signals, parallel-to-serial conversion may be performed on the M signals at the same time, or parallel-to-serial conversion may be performed on each signal. When one processor is used to process multiple signals separately, parallel-to-serial conversion may be performed on one signal, or after frequency-domain signals of the multiple signals are obtained, parallel-to-serial conversion may be performed on the multiple signals. This is not limited in this embodiment of the present invention.

In this embodiment of the present invention, generally, the FFT and the IFFT occur in pairs. Herein, signal filtering in FIG. 1 corresponding to the FFT is called first filtering, and signal filtering in FIG. 2 corresponding to the IFFT is called second filtering. The two times of filtering should meet a specific constraint condition, for example, $$T(z) = \frac{1}{M} \sum_{k=0}^{M-1} H_k(z) F_k(z),$$

where M is a quantity of ways, $H_k(z)$ is a frequency characteristic of the first filtering, $F_k(z)$ is a frequency characteristic of the second filtering, and T(z) has a pure delay characteristic.

Figure 3:
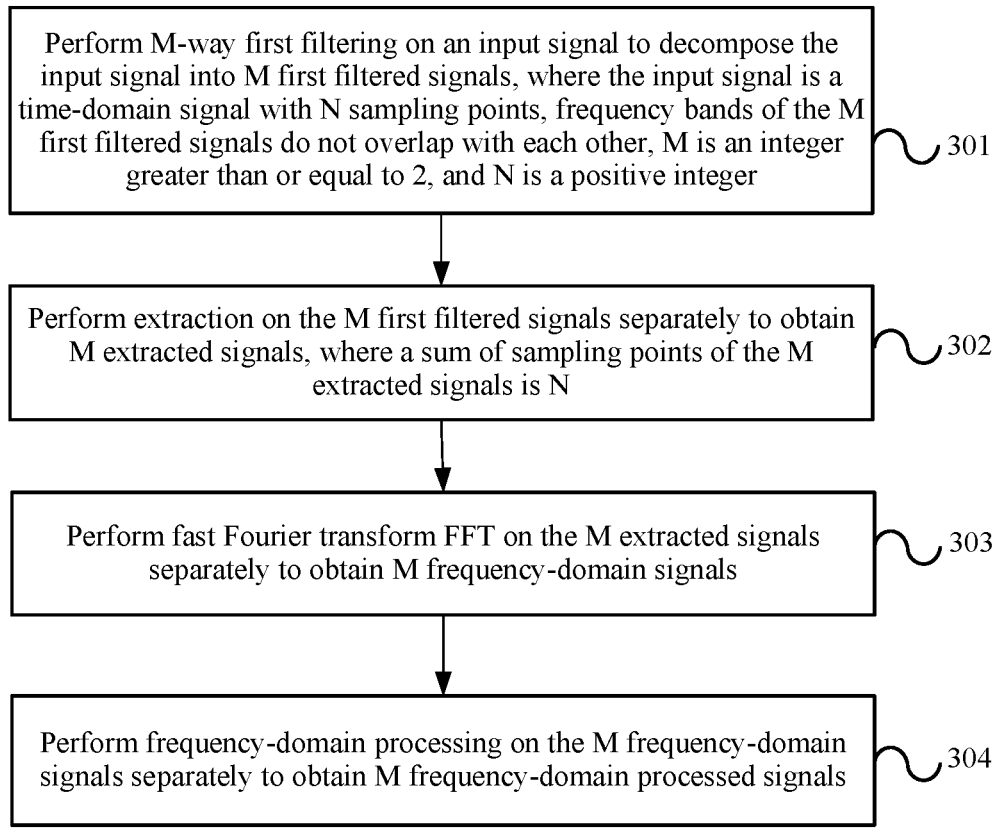
FIG. 3 is a schematic flowchart of a signal processing method according to another embodiment of the present invention.

FIG. 3 is a schematic flowchart of a signal processing method according to another embodiment of the present invention. The method in FIG. 3 may be executed by a receiver in a single-carrier system. The method includes the following steps.

301: Perform M-way first filtering on an input signal to decompose the input signal into M first filtered signals, where the input signal is a time-domain signal with N sampling points, frequency bands of the M first filtered signals do not overlap with each other, M is an integer greater than or equal to 2, and N is a positive integer.

302: Perform extraction on the M first filtered signals separately to obtain M extracted signals, where a sum of sampling points of the M extracted signals is N.

303: Perform fast Fourier transform (FFT) on the M extracted signals separately to obtain M frequency-domain signals.

304: Perform frequency-domain processing on the M frequency-domain signals separately to obtain M frequency-domain processed signals.

According to this embodiment of the present invention, M-way filtering is performed on an input signal; extraction is performed on filtered signals obtained after filtering to obtain extracted signals, so that a sum of sampling points of the M extracted signals is a quantity of sampling points of the input signal; and FFT is performed on the M extracted signals separately. This avoids a problem of a computation complexity increase caused by performing FFT directly on the input signal, and can reduce computation complexity.

It is assumed that in this embodiment of the present invention, a quantity of sampling points of an input signal is N, where N is a positive integer. Preferably, $N=2^m$, where m is a positive integer.

It should be understood that a quantity of sampling points of each extracted signal is not limited in this embodiment of the present invention. A case in which a signal obtained after extraction can be restored to an original signal by means of IFFT shall fall within the protection scope of the present invention.

Optionally, in an embodiment of the present invention, when the sampling points of the input signal are evenly distributed on M ways, a quantity of sampling points of each extracted signal is N/M. Preferably, $N/M=2^p$, where p is a positive integer. It should be understood that when a quantity of sampling points of a signal is not a power of 2, before FFT is performed, zero filling may be performed on the signal, so that the quantity of the sampling points of the signal is a power of 2.

It should be understood that a frequency bandwidth of each first filtered signal is not limited in this embodiment of the present invention. An invention in which a frequency band of the input signal may be decomposed into the frequency bands of the M first filtered signals shall fall within the protection scope of the present invention.

Optionally, in an embodiment of the present invention, when the frequency band of the input signal is evenly distributed on M ways, a frequency band of each first filtered signal of the M first filtered signals occupies 1/M of the frequency band of the input signal.

Optionally, in an embodiment of the present invention, after the frequency-domain signals are obtained by means of the FFT, frequency-domain processing may be further performed on the M frequency-domain signals to obtain M frequency-domain processed signals. Preferably, frequency-domain equalization processing is performed on the M frequency-domain signals to obtain M frequency-domain equalization signals.

In this embodiment of the present invention, the M frequency-domain equalization signals may be used as an input signal in the IFFT, and the IFFT is performed on all the frequency-domain equalization signals on the M ways.

Optionally, in an embodiment of the present invention, after the M frequency-domain processed signals are obtained, inverse fast Fourier transform (IFFT) may be performed on the M frequency-domain processed signals separately to obtain M time-domain signals. Then, interpolation is performed on the M time-domain signals separately to obtain M interpolated signals. A quantity of sampling points of each interpolated signal is N. Then, second filtering is performed on the M interpolated signals separately to obtain M second filtered signals. Finally, output signals is determined according to the M second filtered signals.

After interpolation processing is performed on the signals, a time domain of each signal is expanded, and a frequency domain of each signal is narrowed, that is, distortion occurs. To eliminate the distortion, filtering processing may be performed on each interpolated signal to eliminate mirroring, to obtain a signal on a frequency band, and then addition is performed to restore an undistorted baseband signal. Filtering in this embodiment of the present invention may be digital filtering, or may be analog filtering. That is, signal filtering processing may be implemented by means of digital filtering, or signal filtering processing may be implemented by using multiple filters. This is not limited in this embodiment of the present invention. For example, filtering processing of each of M signals in a filtering array may be implemented by using a program or a filter bank, and filtering processing of different sequence signals is performed by using different amplitudes to remain a signal on a frequency band and filter out a signal on another frequency band. Herein, signal filtering processing may be performed according to an amplitude-frequency characteristic of a synthesis filter. After interpolation and synthesis filtering processing, an IFFT signal may be restored to the original signal, and computation complexity is also reduced.

In an embodiment of the present invention, the M input signals may be processed separately. Herein, separate processing includes parallel processing or serial processing of all the M signals.

Optionally, in an embodiment of the present invention, the performing M-way filtering on an input signal to decompose the input signal into M filtered signals includes: replicating the input signal to obtain M replicated signals of the input signal, and filtering in series the M replicated signals separately to obtain the M filtered signals.

In serial processing of all the M signals, one processor may be used to process all the signals. For example, one processor is used to perform first filtering, extraction, FFT, frequency-domain processing, IFFT, interpolation, and second filtering on all the M signals.

Optionally, in an embodiment of the present invention, the performing M-way filtering on an input signal to decompose the input signal into M filtered signals includes: replicating the input signal to obtain M replicated signals of the input signal, and filtering in parallel the M replicated signals to obtain the M filtered signals.

In parallel processing of all the M signals, different processors may be used to process different signals. For example, one processor of M processors is used to perform first filtering, extraction, FFT, frequency-domain processing, IFFT, interpolation, and second filtering on each of the M signals.

In this embodiment of the present invention, generally, the FFT and the IFFT occur in pairs. Herein, signal filtering corresponding to the FFT is called first filtering, and signal filtering corresponding to the IFFT is called second filtering. The two times of filtering should meet a specific constraint condition, for example, $$T(z) = \frac{1}{M} \sum_{k=0}^{M-1} H_k(z) F_k(z),$$

where M is a quantity of ways, $H_k(z)$ is a frequency characteristic of the first filtering, $F_k(z)$ is a frequency characteristic of the second filtering, and T(z) has a pure delay characteristic.

The following describes this embodiment of the present invention in more detail by using a specific example.

The following describes in detail a signal processing method in the present invention with reference to FIG. 4 to FIG. 7 and specific examples. It should be noted that these examples are used only to help a person skilled in the art better understand this embodiment of the present invention and not to limit the scope of this embodiment of the present invention.

Figure 4:
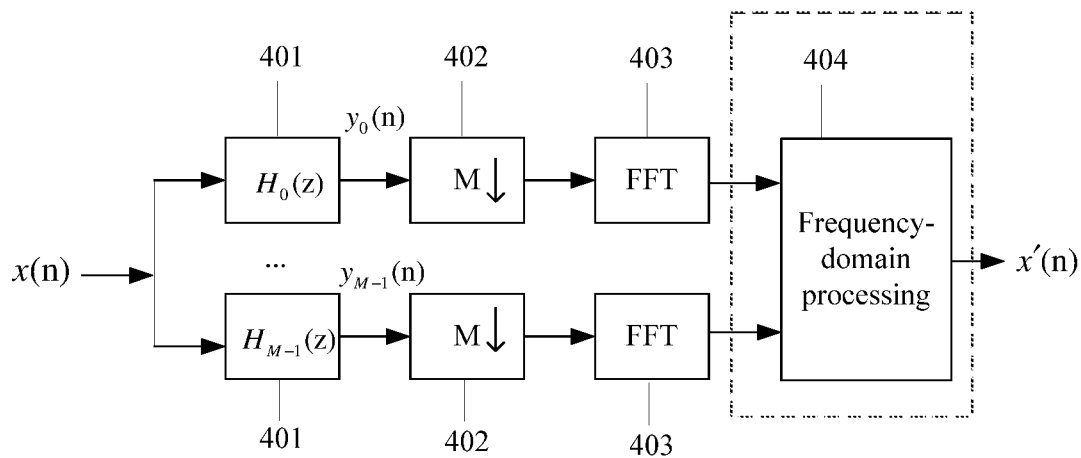
FIG. 4 is a schematic diagram of a signal processing procedure according to an embodiment of the present invention.

FIG. 4 is a schematic diagram of a signal processing procedure according to an embodiment of the present invention. Herein, M different ways are used as an example for exemplary description. M is an integer greater than or equal to 2. The procedure includes the following.

401: Perform M-way filtering on an input signal.

M-way filtering is performed on the input signal to decompose the input signal into M filtered signals. The input signal is a time-domain signal with N sampling points, frequency bands of the M filtered signals do not overlap with each other, M is an integer greater than or equal to 2, and N is a positive integer.

Before M-way filtering is performed on the input signal, serial-to-parallel conversion may be further performed on a to-be-processed signal to obtain parallel to-be-processed signals, and the parallel to-be-processed signals are used as the input signal.

It should be understood that the parallel to-be-processed signals are replicated to obtain M replicated signals. A quantity of sampling points of each replicated signal is the same as a quantity of sampling points of the to-be-processed signal, that is, both are N.

It is assumed that the input signal is x (n), and after M-way filtering processing, the M filtered signals $y_0(n)$, $y_1(n)$, ..., and $y_{M-1}(n)$ are obtained.

Figure 5A:
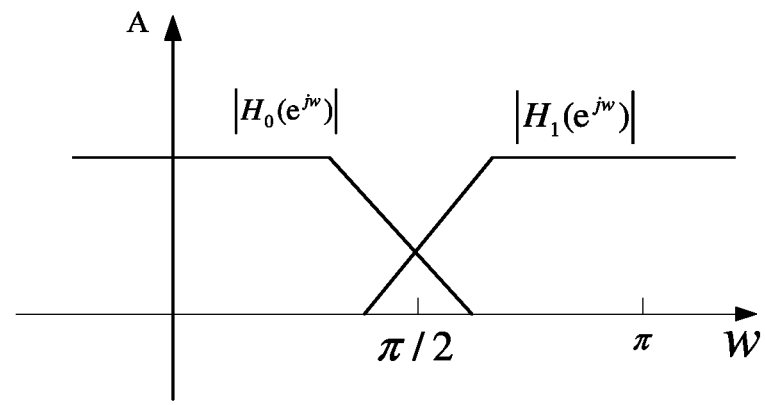
FIG. 5A and FIG. 5B are two different amplitude-frequency characteristic diagrams of a decomposition filter according to an embodiment of the present invention.
Figure 5B:
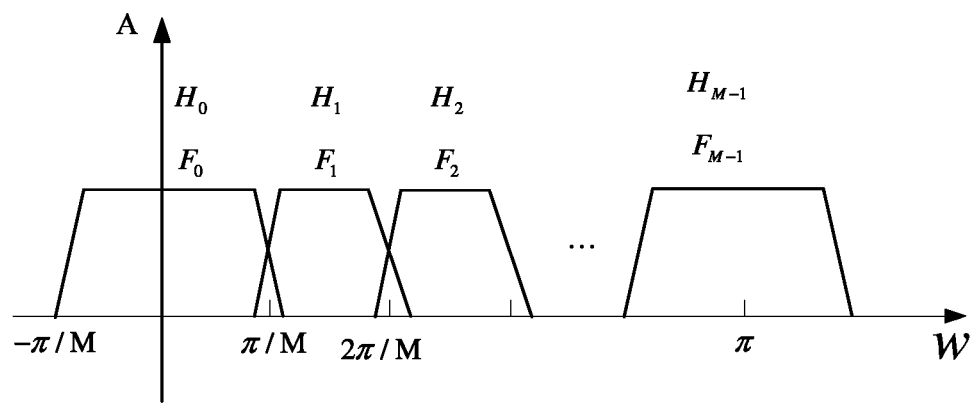

FIG. 5A and FIG. 5B are two different amplitude-frequency characteristic diagrams of a decomposition filter according to an embodiment of the present invention. When M=2, an amplitude-frequency characteristic of the decomposition filter may be shown in FIG. 5A. A decomposition filter bank shown in FIG. 5A includes two decomposition filters. One decomposition filter may be a low-pass filter, and a frequency response amplitude is $|H_0(e^{jw})|$. Another decomposition filter may be a high-pass filter, and a frequency response amplitude is $H_1(e^{jw})|$. When M is greater than 2, an amplitude-frequency characteristic of the decomposition filter may be shown in FIG. 5B. After each decomposition filter performs signal processing, a signal on one frequency band is obtained.

It should be understood that, that the frequency bands of the M filtered signals do not overlap with each other in this embodiment of the present invention is not strictly limited, and a case in which the original signal can be basically restored without distortion on the M frequency bands shall fall within the protection scope of the present invention. For example, non-overlapping in this embodiment of the present invention may be mutual orthogonality between M filters.

It should be understood that analog filtering and digital filtering may be used to perform signal filtering processing herein. This is not limited in the present invention. For example, a decomposition or synthesis filter bank may be used to perform signal decomposition or synthesis filtering processing, or digital filtering may be used to implement signal decomposition or synthesis filtering processing.

402: Perform M times extraction on filtered signals.

M times extraction is performed on the M filtered signals separately to obtain M extracted signals. A quantity of sampling points of the extracted signal is reduced to 1/M of a quantity of sampling points of the to-be-processed signal. It is assumed that the quantity of sampling points of the to-be-processed signal is N, after M times extraction, a quantity of sampling points of each signal changes to N/M. For example, after two times extraction, a quantity of sampling points of each signal changes to N/2.

403: Perform FFT on extracted signals.

The FFT is performed on the M extracted signals separately to obtain M frequency-domain signals. In this case, a computation amount for obtaining an FFT signal by performing filtering, extraction, and FFT is less than a computation amount for performing FFT directly on the to-be-processed signal, and computation complexity can be reduced.

404: Perform frequency-domain processing on frequency-domain signals to obtain frequency-domain processed signals.

Optionally, frequency-domain processing may be performed on the M frequency-domain signals separately to obtain M frequency-domain processed signals. Frequency-domain processing herein may be frequency-domain equalization processing. It should be understood that frequency-domain equalization processing may be performed in series on each frequency-domain signal, or frequency-domain equalization processing may be performed in parallel on the M frequency-domain signals.

Finally, parallel-to-serial conversion may be performed on the frequency-domain processed signals, and a parallel-to-serial conversion result is used as output signals to be output.

In this embodiment of the present invention, the M signals may be processed in series, or the M signals may be processed in parallel. Parallel processing can reduce computation complexity to further improve a computation parallelism degree and increase a signal processing speed.

Figure 6:
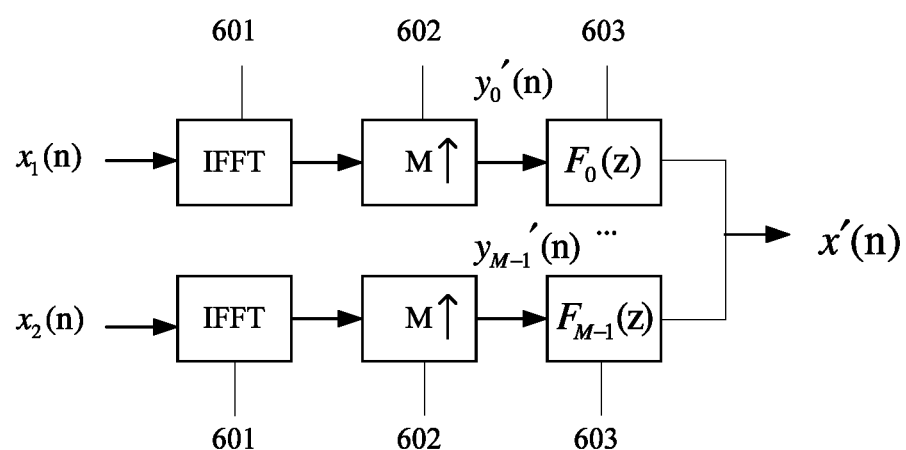
FIG. 6 is a schematic diagram of a signal processing procedure according to another embodiment of the present invention.

FIG. 6 is a schematic diagram of a signal processing procedure according to another embodiment of the present invention. The procedure includes the following steps.

601: Perform inverse fast Fourier transform (IFFT) on M decomposed signals separately.

The inverse fast Fourier transform (IFFT) is performed on the M decomposed signals separately to obtain M time-domain signals.

Herein, the M decomposed signals are obtained by decomposing an input signal. Frequency bands of the M decomposed signals do not overlap with each other. The input signal is a frequency-domain signal with N sampling points. A sum of sampling points of the M decomposed signals is N, M is an integer greater than or equal to 2, and N is a positive integer.

Before the inverse fast Fourier transform (IFFT) is performed on the M decomposed signals separately, serial-to-parallel conversion may be further performed on a to-beprocessed signal to obtain parallel to-be-processed signals, and the parallel to-be-processed signals are decomposed to obtain the M decomposed signals.

Before the inverse fast Fourier transform (IFFT) is performed on the M decomposed signals separately, each signal may be further decomposed, frequency-domain processing is performed on signals obtained after decomposition, and obtained signals are used as the decomposed signals.

602: Perform M times interpolation on M time-domain signals separately.

M times interpolation is performed on the M time-domain signals separately to obtain M interpolated signals $y_0'(n), \ldots,$ and $y_{M-1}'(n)$. A quantity of sampling points of each interpolated signal is the same as a quantity of sampling points of the original input signal x(n). Interpolation may be interpolating a value between two sampling points of the time-domain signal. For example, in the M times interpolation, M−1 zeros may be interpolated between every two sampling points of the signal.

Assuming that a quantity of sampling points of the input signal is N, and a quantity of sampling points of each decomposed signal is N/M, a quantity of sampling points of each interpolated signal is N.

603: Perform filtering processing on M interpolated signals separately.

The M interpolated signals are filtered separately to obtain M filtered signals. After interpolation processing is performed on the signals, a frequency band of each signal is expanded, and the interpolated signals include frequency-domain mirrored signals. To eliminate the mirrored signals, filtering processing may be performed on each interpolated signal to obtain a signal on a frequency band. Filtering in this embodiment of the present invention may be digital filtering, or may be analog filtering.

Optionally, after the M interpolated signals are obtained, serial-to-parallel conversion may be performed on the M filtered signals to obtain parallel signals, and the parallel signals are used as output signals.

In this embodiment of the present invention, serial processing may be performed on M ways, or parallel processing may be performed on the M ways. Parallel processing can reduce computation complexity and also further improve a computation parallelism degree.

Figure 7:
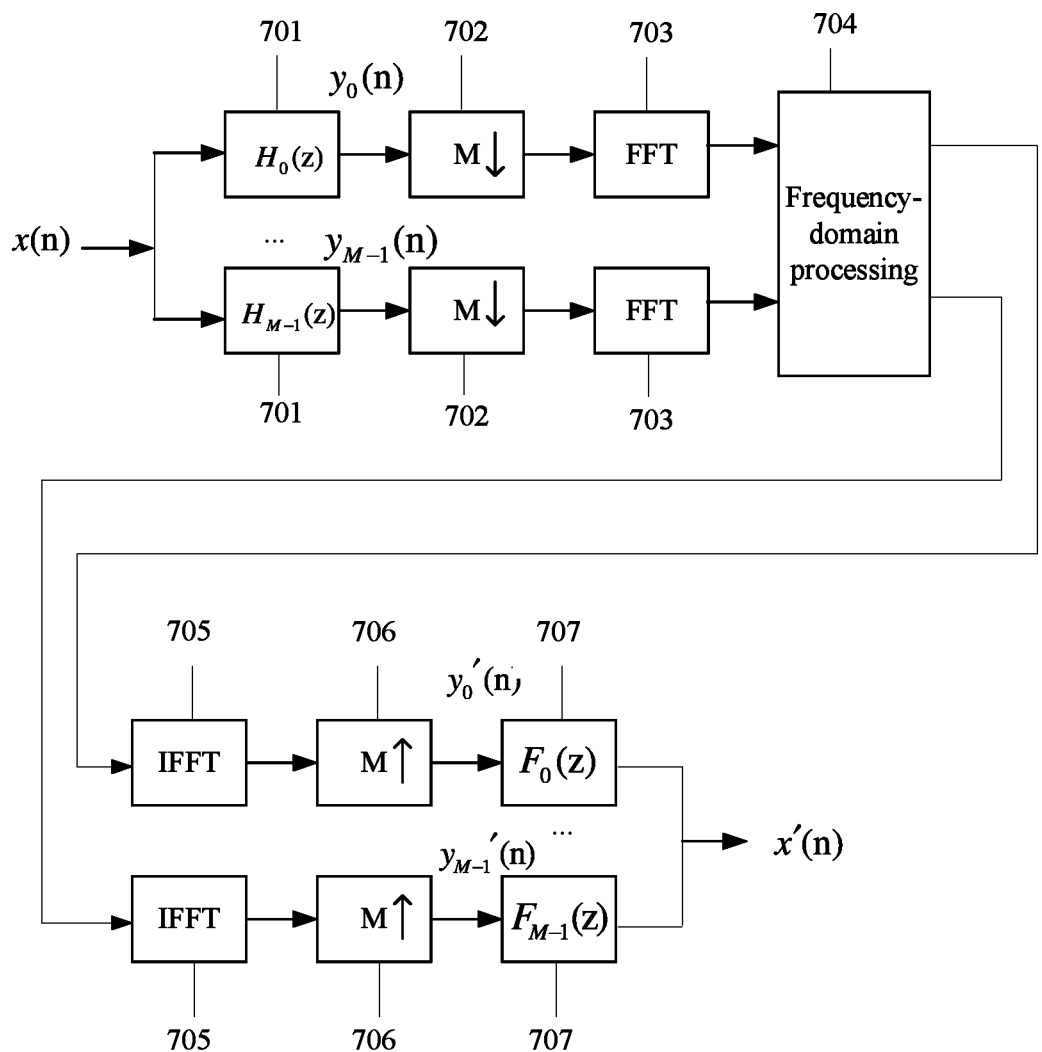
FIG. 7 is a schematic diagram of a signal processing procedure according to another embodiment of the present invention.

FIG. 7 is a schematic diagram of a signal processing procedure according to another embodiment of the present invention. The procedure includes the following steps.

701: Perform M-way first filtering on an input signal.

M-way first filtering is performed on the input signal to decompose the input signal into M first filtered signals. The input signal is a time-domain signal with N sampling points, frequency bands of the M filtered signals do not overlap with each other, M is an integer greater than or equal to 2, and N is a positive integer.

Before M-way first filtering is performed on the input signal, serial-to-parallel conversion may be further performed on a to-be-processed signal to obtain parallel to-be-processed signals, and the parallel to-be-processed signals are used as the input signal.

It should be understood that the parallel to-be-processed signals are replicated to obtain M replicated signals. A quantity of sampling points of each replicated signal is the same as a quantity of sampling points of the to-be-processed signal, that is, both are N.

It is assumed that the input signal is x(n), and after M-way first filtering processing, the M filtered signals $y_0(n), y_1(n), \ldots,$ and $y_{M-1}(n)$ are obtained.

702: Perform M times extraction on first filtered signals.

M times extraction is performed on M first filtered signals separately to obtain M extracted signals. A quantity of sampling points of the extracted signal is reduced to 1/M of a quantity of sampling points of the to-be-processed signal. It is assumed that the quantity of sampling points of the to-be-processed signal is N, after M times extraction, a quantity of sampling points of each signal changes to N/M. For example, after two times extraction, a quantity of sampling points of each signal changes to N/2.

703: Perform FFT on extracted signals.

The FFT is performed on the M extracted signals separately to obtain M frequency-domain signals. In this case, a computation amount for obtaining an FFT signal by performing filtering, extraction, and FFT is less than a computation amount for performing FFT directly on the to-be-processed signal, and computation complexity can be reduced.

704: Perform frequency-domain processing on frequency-domain signals to obtain frequency-domain processed signals.

Optionally, frequency-domain processing is performed on the M frequency-domain signals separately, and M frequency-domain processed signals may be obtained. Frequency-domain processing herein may be frequency-domain equalization processing. It should be understood that frequency-domain equalization processing may be performed in series on each frequency-domain signal, or frequency-domain equalization processing may be performed in parallel on the M frequency-domain signals.

705: Perform IFFT on the M frequency-domain processed signals separately.

The inverse fast Fourier transform (IFFT) is performed on the M frequency-domain processed signals separately to obtain M time-domain signals.

706: Perform M times interpolation on M time-domain signals separately.

M times interpolation is performed on the M time-domain signals separately to obtain M interpolated signals $y_0'(n), \ldots,$ and $y_{M-1}'(n)$. A quantity of sampling points of the M interpolated signals is the same as a quantity of sampling points of the input signal x (n). Interpolation may be interpolating a value between two sampling points of the time-domain signal.

707: Perform second filtering processing on M interpolated signals separately.

Second filtering processing is performed on the M interpolated signals to obtain all second filtered signals. After interpolation processing is performed on the signals, a frequency band of each signal is expanded, and the interpolated signals include frequency-domain mirrored signals. To eliminate the mirrored signals, filtering processing may be performed on each interpolated signal to obtain a signal on a frequency band. Synthesis filtering in this embodiment of the present invention may be digital filtering, or may be analog filtering.

After the second filtered signals are obtained, serial-to-parallel conversion may be performed on the M second filtered signals to obtain parallel signals, and the parallel signals are used as the output signals.

A receiver in a single-carrier system includes an FFT module and also includes an IFFT module. In this case, signal filtering and extraction are performed before the FFT, and signal interpolation and filtering are performed after the IFFT. This can reduce a computation amount. Further, when parallel processing is performed on the M signals, a computation parallelism degree may be further improved. This accelerates data processing.

It should be understood that this embodiment of the present invention may not only be applied to a communications system, but also may be applied to graphics processing. A solution in which the FFT and the IFFT occur in pairs, and a computation amount is reduced by using an implementation of the present invention falls within the protection scope of the present invention.

It should be understood that this embodiment of the present invention may not only be applied to a one-dimensional system, but also may be applied to a two-dimensional system. This is not limited in this embodiment of the present invention.

With reference to FIG. 1 to FIG. 7, the foregoing describes in detail a signal processing method according to an embodiment of the present invention. The following describes, with reference to FIG. 8 to FIG. 13, a signal processing apparatus according to an embodiment of the present invention.

Figure 8:
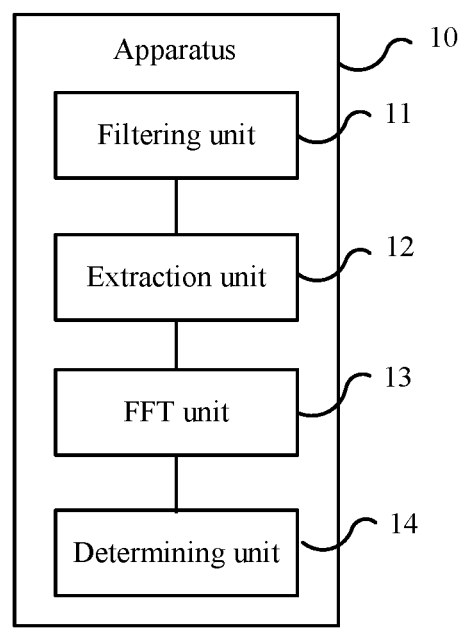
FIG. 8 is a block diagram of a signal processing apparatus according to an embodiment of the present invention.

FIG. 8 is a block diagram of a signal processing apparatus according to an embodiment of the present invention. The apparatus 10 in FIG. 8 includes a filtering unit 11, an extraction unit 12, a fast Fourier transform (FFT) unit 13, and a determining unit 14.

The filtering unit 11 includes M filters. The M filters are separately configured to filter an input signal to obtain M filtered signals. The input signal is a time-domain signal with N sampling points. Frequency bands of the M filtered signals do not overlap with each other. M is an integer greater than or equal to 2, and N is a positive integer.

The extraction unit 12 includes M extractors. The M extractors are connected to the M filters in a one-to-one correspondence. The M extractors are separately configured to respectively extract the M filtered signals obtained by the filtering unit to obtain M extracted signals. A sum of sampling points of the M extracted signals is N.

The fast Fourier transform (FFT) unit 13 includes M FFT transformers. The M FFT transformers are connected to the M extractors in a one-to-one correspondence. The M FFT transformers are configured to perform fast Fourier transform (FFT) respectively on the M extracted signals obtained by the extraction unit to obtain M frequency-domain signals.

The determining unit 14 is configured to obtain output signals according to the M frequency-domain signals obtained by the FFT unit.

According to this embodiment of the present invention, M-way filtering is performed on an input signal; extraction is performed on filtered signals obtained after filtering to obtain extracted signals, so that a sum of sampling points of the M extracted signals is a quantity of sampling points of the input signal; and FFT is performed on the M extracted signals separately. This avoids a problem of a computation complexity increase caused by performing FFT directly on the input signal, and can reduce computation complexity.

Optionally, in an embodiment of the present invention, a frequency band of each of the M filtered signals occupies 1/M of a frequency band of the input signal.

Optionally, in an embodiment of the present invention, a quantity of sampling points of each extracted signal is N/M.

Optionally, in an embodiment of the present invention, the filtering unit is specifically configured to replicate the input signal to obtain M replicated signals of the input signal. The M filters filter, in series or in parallel, the M replicated signals to obtain the M filtered signals.

The signal processing apparatus in this embodiment of the present invention may correspond to a corresponding apparatus in a method in an embodiment of the present invention. In addition, each unit/module in the apparatus and another foregoing operation and/or function are used to separately implement a corresponding process in the method shown in FIG. 1 and a corresponding process in FIG. 4. For brevity, details are not described repeatedly herein.

Figure 9:
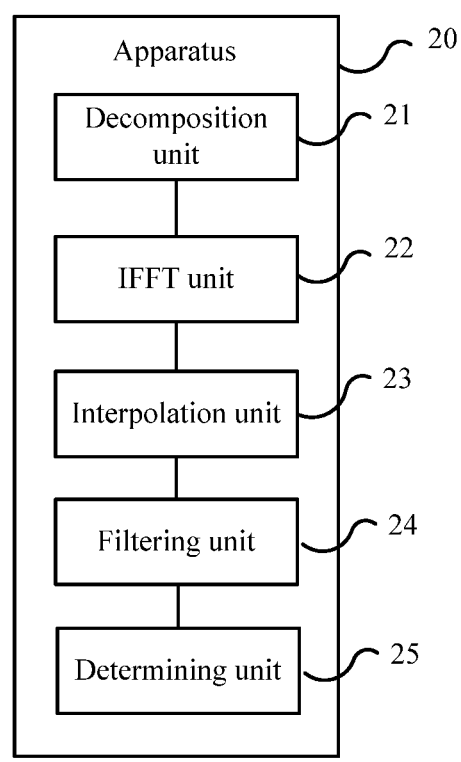
FIG. 9 is a block diagram of a signal processing apparatus according to another embodiment of the present invention.

FIG. 9 is a block diagram of a signal processing apparatus according to another embodiment of the present invention. The apparatus 20 in FIG. 9 includes a decomposition unit 21, an inverse fast Fourier transform (IFFT) unit 22, an interpolation unit 23, a filtering unit 24, and a determining unit 25.

The decomposition unit 21 is configured to decompose an input signal to obtain M decomposed signals. Frequency bands of the M decomposed signals do not overlap with each other. The input signal is a frequency-domain signal with N sampling points. A sum of sampling points of the M decomposed signals is N, M is an integer greater than or equal to 2, and N is a positive integer.

The inverse fast Fourier transform (IFFT) unit 22 includes M IFFT transformers. The M decomposed signals are respectively input into the M IFFT transformers in a one-to-one correspondence. The M IFFT transformers are configured to respectively perform inverse fast Fourier transform (IFFT) on the M decomposed signals obtained by the decomposition unit to obtain M time-domain signals.

The interpolation unit 23 includes M interpolators. The M interpolators are connected to the M IFFT transformers in a one-to-one correspondence. The M interpolators are configured to perform interpolation respectively on the M time-domain signals obtained by the IFFT unit to obtain M interpolated signals. A quantity of sampling points of each interpolated signal is N.

The filtering unit 24 includes M filters. The M filters are connected to the M interpolators in a one-to-one correspondence. The M filters are configured to respectively filter the M interpolated signals obtained by the interpolation unit to obtain M filtered signals.

The determining unit 25 is configured to determine output signals according to the M filtered signals obtained by the filtering unit.

According to this embodiment of the present invention, an input signal is decomposed, IFFT is performed separately on decomposed signals obtained after decomposition, interpolation is performed on time-domain signals obtained after the IFFT, and finally signals obtained after interpolation are filtered, and output signals is obtained. In this way, the IFFT is performed on the M decomposed signals separately, avoiding a problem of a computation complexity increase caused by performing IFFT directly on the input signal, and reducing computation complexity.

Optionally, in an embodiment of the present invention, a frequency band of each decomposed signal occupies 1/M of a frequency band of the input signal.

Optionally, in an embodiment of the present invention, a quantity of sampling points of each decomposed signal is N/M.

Optionally, in an embodiment of the present invention, the M IFFT transformers are specifically configured to perform, in series or in parallel, the inverse fast Fourier transform (IFFT) respectively on the M decomposed signals to obtain the M time-domain signals.

The signal processing apparatus in this embodiment of the present invention may correspond to an apparatus in a method in an embodiment of the present invention. In addition, each unit/module in the apparatus and another foregoing operation and/or function are used to separately implement a corresponding process in the method shown in FIG. 2 and a corresponding process in FIG. 6. For brevity, details are not described repeatedly herein.

Figure 10:
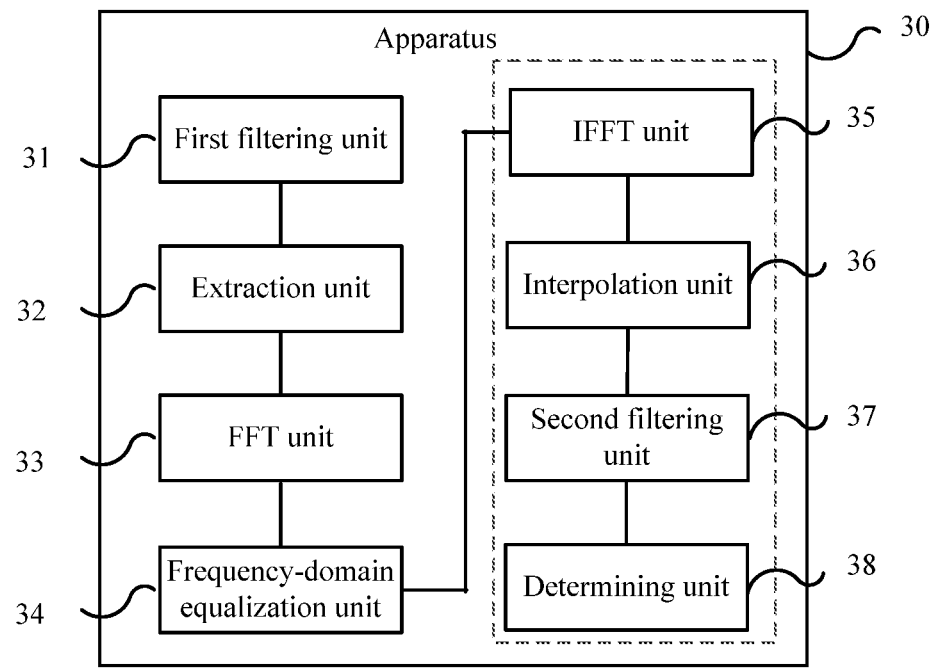
FIG. 10 is a block diagram of a signal processing apparatus according to another embodiment of the present invention.

FIG. 10 is a block diagram of a signal processing apparatus according to another embodiment of the present invention. The apparatus 30 in FIG. 10 includes a first filtering unit 31, an extraction unit 32, a fast Fourier transform (FFT) unit 33, and a frequency-domain equalization unit 34.

The first filtering unit 31 includes M first filters. The M first filters are configured to perform M-way first filtering on an input signal to decompose the input signal into M first filtered signals. The input signal is a time-domain signal with N sampling points. Frequency bands of the M first filtered signals do not overlap with each other. M is an integer greater than or equal to 2, and N is a positive integer.

The extraction unit 32 includes M extractors. The M extractors are connected to the M first filters in a one-to-one correspondence. The M extractors are configured to perform extraction on the M first filtered signals respectively to obtain M extracted signals. A sum of sampling points of the M extracted signals is N.

The fast Fourier transform (FFT) unit 33 includes M FFT transformers. The M FFT transformers are connected to the M extractors in a one-to-one correspondence. The M FFT transformers are configured to perform fast Fourier transform (FFT) on the M extracted signals respectively to obtain M frequency-domain signals.

The frequency-domain equalization unit 34 includes M frequency-domain equalizers. The M frequency-domain equalizers are connected to the M FFT transformers in a one-to-one correspondence. The M frequency-domain equalizers are configured to perform frequency-domain processing on the M frequency-domain signals respectively to obtain M frequency-domain processed signals.

According to this embodiment of the present invention, M-way filtering is performed on an input signal; extraction is performed on filtered signals obtained after filtering to obtain extracted signals, so that a sum of sampling points of the M extracted signals is a quantity of sampling points of the input signal; and FFT is performed on the M extracted signals separately. This avoids a problem of a computation complexity increase caused by performing FFT directly on the input signal, and can reduce computation complexity.

Optionally, in an embodiment of the present invention, a frequency band of each filtered signal of the M first filtered signals occupies 1/M of a frequency band of the input signal.

Optionally, in an embodiment of the present invention, a quantity of sampling points of each extracted signal is N/M.

Optionally, in an embodiment of the present invention, the apparatus 30 may further include an inverse fast Fourier transform (IFFT) unit 35, an interpolation unit 36, a second filtering unit 37, and a determining unit 38. The inverse fast Fourier transform (IFFT) unit 35 includes M IFFT transformers. The M IFFT transformers are connected to the M frequency-domain equalizers in a one-to-one correspondence. The M IFFT transformers are configured to perform inverse fast Fourier transform (IFFT) on the M frequency-domain processed signals respectively to obtain M time-domain signals. The interpolation unit 36 includes M interpolators. The M interpolators are connected to the M IFFT transformers in a one-to-one correspondence. The M interpolators are configured to perform interpolation respectively on the M time-domain signals to obtain M interpolated signals. A quantity of sampling points of each interpolated signal is N. The second filtering unit 37 includes M second filters. The M second filters are connected to the M interpolators in a one-to-one correspondence. The M second filters are configured to perform second filtering respectively on the M interpolated signals to obtain M second filtered signals. The determining unit 38 is configured to determine output signals according to the M second filtered signals.

The signal processing apparatus in this embodiment of the present invention may correspond to an apparatus in a method in an embodiment of the present invention. In addition, each unit/module in the apparatus and another foregoing operation and/or function are used to separately implement a corresponding process in the method shown in FIG. 3 and a corresponding process in FIG. 7. For brevity, details are not described repeatedly herein.

Figure 11:
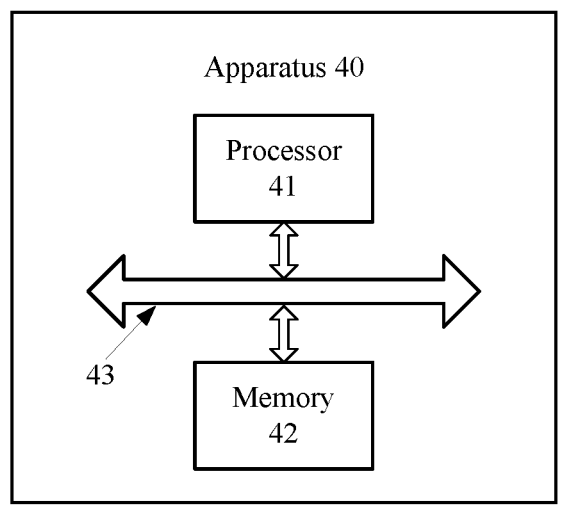
FIG. 11 is a block diagram of a signal processing apparatus according to an embodiment of the present invention.

FIG. 11 is a block diagram of a signal processing apparatus according to another embodiment of the present invention.

The apparatus 40 in FIG. 11 includes a processor 41, a memory 42, and a bus system 43. The processor 41 controls an operation of the apparatus 40. The memory 42 may include a read-only memory and a random access memory, and provide an instruction and data for the processor 41. A part of the memory 42 may further include a non-volatile random access memory (NVRAM, Non-Volatile Random Access Memory). All components of the apparatus are coupled together by using the bus system 43. In addition to including a data bus, the bus system 43 may further include a power bus, a control bus, and a status signal bus. For clear description, all buses in the figure are marked as the bus system 43.

The foregoing methods disclosed in the embodiments of the present invention may be applied to the processor 41 or implemented by the processor 41. In an implementation process, each step in the foregoing methods may be completed by hardware, that is, an integrated logical circuit in the processor 41, or by an instruction in a software form. The processor 41 may be a universal processor, a digital signal processor, an application-specific integrated circuit, a field-programmable gate array or another programmable logic device, a discrete gate or a transistor logic device, or a discrete hardware component, and may implement or execute methods, steps, or logic block diagrams disclosed in the embodiments of the present invention. The universal processor may be a microprocessor, any conventional processor, or the like. The steps of the methods disclosed with reference to the embodiments of the present invention may be directly implemented by a hardware processor, or implemented by a combination of hardware and a software module of the processor. The software module may be located in a mature storage medium in the art, such as a random memory, a flash memory, and a read-only memory, a programmable read-only memory or an electrically erasable programmable memory, or a register. The storage medium is located in the memory 42. The processor 41 reads information in the memory 42, and completes the steps in the foregoing methods by using the hardware of the processor 41.

Specifically, the processor 41 may use M filters to filter an input signal to obtain M filtered signals. The input signal is a time-domain signal with N sampling points. Frequency bands of the M filtered signals do not overlap with each other. M is an integer greater than or equal to 2, and N is a positive integer. The processor 41 uses M extractors to perform extraction on the M filtered signals respectively to obtain M extracted signals. A sum of sampling points of the M extracted signals is N. The processor 41 performs fast Fourier transform (FFT) on the M extracted signals to obtain M frequency-domain signals, and obtains output signals according to the M frequency-domain signals.

The apparatus 40 can implement the steps in the foregoing method embodiments. To avoid repetition, details are not described again.

Optionally, in an embodiment of the present invention, a frequency band of each of the M filtered signals occupies 1/M of a frequency band of the input signal.

Optionally, in an embodiment of the present invention, a quantity of sampling points of each extracted signal is N/M.

Optionally, in an embodiment of the present invention, the processor 41 may replicate the input signal to obtain M replicated signals of the input signal, and filter, in series or in parallel, the M replicated signals to obtain the M filtered signals.

The signal processing apparatus in this embodiment of the present invention may correspond to a corresponding apparatus in a method in an embodiment of the present invention. In addition, each unit/module in the apparatus and another foregoing operation and/or function are used to separately implement a corresponding process in the method shown in FIG. 1 and a corresponding process in FIG. 4. For brevity, details are not described repeatedly herein.

Figure 12:
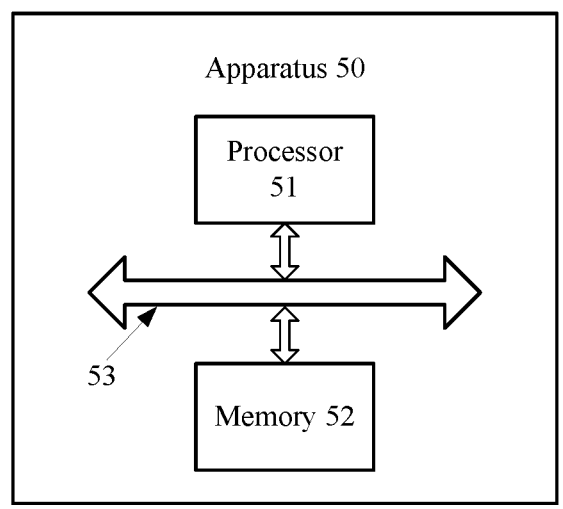
FIG. 12 is a block diagram of a signal processing apparatus according to another embodiment of the present invention.

FIG. 12 is a block diagram of a signal processing apparatus according to another embodiment of the present invention.

The apparatus 50 in FIG. 12 includes a processor 51, a memory 52, and a bus system 53. The processor 51 controls an operation of the apparatus 50. The memory 52 may include a read-only memory and a random access memory, and provide an instruction and data for the processor 51. A part of the memory 52 may further include a non-volatile random access memory (NVRAM). All components of the apparatus are coupled together by using the bus system 53. In addition to including a data bus, the bus system 53 may further include a power bus, a control bus, and a status signal bus. For clear description, all buses in the figure are marked as the bus system 53.

The methods disclosed in the foregoing embodiments of the present invention may be applied to the processor 51 or implemented by the processor 51. In an implementation process, each step in the foregoing methods may be completed by hardware, that is, an integrated logical circuit in the processor 51, or by an instruction in a software form. The processor 51 may be a universal processor, a digital signal processor, an application-specific integrated circuit, a field-programmable gate array or another programmable logic device, a discrete gate or a transistor logic device, or a discrete hardware component, and may implement or execute methods, steps, or logic block diagrams disclosed in the embodiments of the present invention. The universal processor may be a microprocessor, any conventional processor, or the like. The steps of the methods disclosed with reference to the embodiments of the present invention may be directly implemented by a hardware processor, or implemented by a combination of hardware and a software module of the processor. The software module may be located in a mature storage medium in the art, such as a random memory, a flash memory, and a read-only memory, a programmable read-only memory or an electrically erasable programmable memory, or a register. The storage medium is located in the memory 52. The processor 51 reads information in the memory 52, and completes the steps in the foregoing methods by using the hardware of the processor 51.

Specifically, the processor 51 may decompose an input signal to obtain M decomposed signals. Frequency bands of the M decomposed signals do not overlap with each other. The input signal is a frequency-domain signal with N sampling points. A sum of sampling points of the M decomposed signals is N, M is an integer greater than or equal to 2, and N is a positive integer. The processor 51 performs inverse fast Fourier transform (IFFT) on the M decomposed signals separately to obtain M time-domain signals. The processor 51 performs interpolation on the M time-domain signals separately to obtain M interpolated signals. A quantity of sampling points of each interpolated signal is N. The processor 51 filters the M interpolated signals separately to obtain M filtered signals, and determines output signals according to the M filtered signals.

According to this embodiment of the present invention, an input signal is decomposed, IFFT is performed separately on decomposed signals obtained after decomposition, interpolation is performed on time-domain signals obtained after the IFFT, and finally signals obtained after interpolation are filtered, and output signals is obtained. In this way, the IFFT is performed on the M decomposed signals separately, avoiding a problem of a computation complexity increase caused by performing IFFT directly on the input signal, and reducing computation complexity.

The signal processing apparatus 50 in this embodiment of the present invention may correspond to an apparatus in a method in an embodiment of the present invention. In addition, each unit/module in the apparatus and another foregoing operation and/or function are used to separately implement a corresponding process in the method shown in FIG. 2 and a corresponding process in FIG. 6. For brevity, details are not described repeatedly herein.

Optionally, in an embodiment of the present invention, a frequency band of each decomposed signal occupies 1/M of a frequency band of the input signal.

Optionally, in an embodiment of the present invention, a quantity of sampling points of each decomposed signal is N/M.

Optionally, in an embodiment of the present invention, the processor 51 is configured to perform the inverse fast Fourier transform (IFFT) in series or in parallel on the M decomposed signals to obtain the M time-domain signals.

Figure 13:
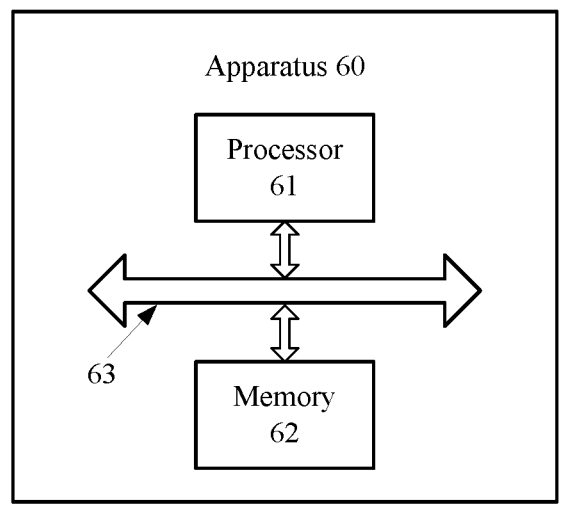
FIG. 13 is a block diagram of a signal processing apparatus according to another embodiment of the present invention.

FIG. 13 is a block diagram of a signal processing apparatus according to another embodiment of the present invention.

The apparatus 60 in FIG. 6 includes a processor 61, a memory 62, and a bus system 63. The processor 61 controls an operation of the apparatus 60. The memory 62 may include a read-only memory and a random access memory, and provide an instruction and data for the processor 61. A part of the memory 62 may further include a non-volatile random access memory (NVRAM). All components of the apparatus are coupled together by using the bus system 63. In addition to including a data bus, the bus system 63 may further include a power bus, a control bus, and a status signal bus. For clear description, all buses in the figure are marked as the bus system 63.

The methods disclosed in the foregoing embodiments of the present invention may be applied to the processor 61 or implemented by the processor 61. In an implementation process, each step in the foregoing methods may be completed by hardware, that is, an integrated logical circuit in the processor 61, or by an instruction in a software form. The processor 61 may be a universal processor, a digital signal processor, an application-specific integrated circuit, a field-programmable gate array or another programmable logic device, a discrete gate or a transistor logic device, or a discrete hardware component, and may implement or execute methods, steps, or logic block diagrams disclosed in the embodiments of the present invention. The universal processor may be a microprocessor, any conventional processor, or the like. The steps of the methods disclosed with reference to the embodiments of the present invention may be directly implemented by a hardware processor, or implemented by a combination of hardware and a software module of the processor. The software module may be located in a mature storage medium in the art, such as a random memory, a flash memory, and a read-only memory, a programmable read-only memory or an electrically erasable programmable memory, or a register. The storage medium is located in the memory 62. The processor 61 reads information in the memory 62, and completes the steps in the foregoing methods by using the hardware of the processor 61.

Specifically, the processor 61 may perform M-way first filtering on an input signal to decompose the input signal into M first filtered signals. The input signal is a time-domain signal with N sampling points. Frequency bands of the M first filtered signals do not overlap with each other. M is an integer greater than or equal to 2, and N is a positive integer. The processor 61 performs extraction on the M first filtered signals separately to obtain M extracted signals. A sum of sampling points of the M extracted signals is N. The processor 61 performs fast Fourier transform (FFT) on the M extracted signals separately to obtain M frequency-domain signals. The processor 61 performs frequency-domain processing on the M frequency-domain signals separately to obtain M frequency-domain processed signals.

According to this embodiment of the present invention, M-way filtering is performed on an input signal; extraction is performed on filtered signals obtained after filtering to obtain extracted signals, so that a sum of sampling points of the M extracted signals is a quantity of sampling points of the input signal; and FFT is performed on the M extracted signals separately. This avoids a problem of a computation complexity increase caused by performing FFT directly on the input signal, and can reduce computation complexity.

Optionally, in an embodiment of the present invention, a frequency band of each filtered signal of the M first filtered signals occupies 1/M of a frequency band of the input signal.

Optionally, in an embodiment of the present invention, a quantity of sampling points of each extracted signal is N/M.

Optionally, in an embodiment of the present invention, the processor 61 may further perform inverse fast Fourier transform (IFFT) on the M frequency-domain processed signals separately to obtain M time-domain signals. The processor 61 performs interpolation on the M time-domain signals separately to obtain M interpolated signals. A quantity of sampling points of each interpolated signal is N. The processor 61 performs second filtering on the M interpolated signals separately to obtain M second filtered signals, and determines output signals according to the M second filtered signals.

The apparatus 60 can implement the steps in the foregoing method embodiments. To avoid repetition, details are not described again.

The signal processing apparatus in this embodiment of the present invention may correspond to an apparatus in a method in an embodiment of the present invention. In addition, each unit/module in the apparatus and another foregoing operation and/or function are used to separately implement a corresponding process in the method shown in FIG. 3 and a corresponding process in FIG. 7. For brevity, details are not described repeatedly herein.

It should be understood that "one embodiment" or "an embodiment" mentioned throughout the specification indicates that a particular characteristic, structure or property that is related to the embodiment is included in at least one embodiment of the present invention. Therefore, "in one embodiment" or "in an embodiment" that appears throughput the entire specification does not necessarily mean a same embodiment. Moreover, the particular characteristic, structure or property may be combined in one or more embodiments in any proper manner.

It should be understood that sequence numbers of the foregoing processes do not mean execution sequences in various embodiments of the present invention. The execution sequences of the processes should be determined according to functions and internal logic of the processes, and should not be construed as any limitation on the implementation processes of the embodiments of the present invention.

It should be understood that in the embodiments of the present invention, "B corresponding to A" indicates that B is associated with A, and B may be determined according to A. However, it should further be understood that determining B according to A does not mean that B is determined according to A only; that is, B may also be determined according to A and/or other information.

In addition, the terms "system" and "network" may be used interchangeably in this specification. The term "and/or" in this specification describes only an association relationship for describing associated objects and represents that three relationships may exist. For example, A and/or B may represent the following three cases: Only A exists, both A and B exist, and only B exists. In addition, the character "/" in this specification generally indicates an "or" relationship between the associated objects.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of the present invention.

It may be clearly understood by a person skilled in the art that, for the purpose of convenient and brief description, for a detailed working process of the foregoing system, apparatus, and unit, reference may be made to a corresponding process in the foregoing method embodiments, and details are not described.

In the several embodiments provided in this application, it should be understood that the disclosed system, apparatus, and method may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual needs to achieve the objectives of the solutions of the embodiments.

In addition, functional units in the embodiments of the present invention may be integrated into one processing unit, or each of the units may exist alone physically, or two or more units are integrated into one unit.

The foregoing descriptions are merely specific implementations of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A computer-implemented signal processing method in a single-carrier system, comprising:
    performing M-way first filtering, by M first filters, on an input signal to decompose the input signal into M first filtered signals, wherein the input signal is a time-domain signal with N sampling points, frequency bands of the M first filtered signals do not overlap with each other, M is an integer greater than or equal to 2, and N is a positive integer;
    separately performing, by M extractors, extraction on the M first filtered signals to obtain M extracted signals, wherein a sum of sampling points of the M extracted signals is N, each extractor coupled to a corresponding first filter;
    separately performing, by M fast Fourier transform (FFT) transformers, fast Fourier transform (FFT) on the M extracted signals to obtain M frequency-domain signals, each FFT tranformer coupled to a corresponding extractor;
    separately performing, by frequency-domain processors, frequency-domain processing on the M frequency-domain signals to obtain M frequency-domain processed signals, the frequency-domain processors coupled to the FFT transformers;
    separately performing, by M inverse fast Fourier transform (IFFT) transformers, inverse fast Fourier transform (IFFT) on the M frequency-domain processed signals to obtain M time-domain signals, the IFFT transformers coupled to the frequency-domain processors;
    separately performing, by M interpolators, interpolation on the M time-domain signals to obtain M interpolated signals, wherein a quantity of sampling points of each interpolated signal is N, each interpolator coupled to a corresponding IFFT transformer; and
    separately performing, by M second filters, second filtering on the M interpolated signals to obtain M second filtered signals, each second filter coupled to a corresponding interpolator; and
    determining output signals according to the M second filtered signals.

2. The method according to claim 1, wherein a frequency band of each filtered signal of the M first filtered signals occupies 1/M of a frequency band of the input signal.

3. The method according to claim 1, wherein a quantity of sampling points of each extracted signal is N/M.

4. An apparatus, comprising:
    one or more processors; and
    a non-transitory computer-readable storage medium storing a program to be executed by the one or more processors, the program including instructions for:
    performing M-way first filtering, by M first filters, on an input signal to decompose the input signal into M first filtered signals, wherein the input signal is a time-domain signal with N sampling points, frequency bands of the M first filtered signals do not overlap with each other, M is an integer greater than or equal to 2, and N is a positive integer;
    separately performing, by M extractors, extraction on the M first filtered signals to obtain M extracted signals, wherein a sum of sampling points of the M extracted signals is N, each extractor coupled to a corresponding first filter;
    separately performing, by M fast Fourier transform (FFT) transformers, FFT on the M extracted signals to obtain M frequency-domain signals, each FFT tranformer coupled to a corresponding extractor;
    separately performing, by frequency-domain processors, frequency-domain processing on the M frequency-domain signals to obtain M frequency-domain processed signals, the frequency-domain processors coupled to the FFT transformers;
    separately performing, by M inverse fast Fourier transform (IFFT) transformers, IFFT on the M frequency-domain processed signals to obtain M time-domain signals, the IFFT transformers coupled to the frequency-domain processors;
    separately performing, by M interpolators, interpolation on the M time-domain signals to obtain M interpolated signals, wherein a quantity of sampling points of each interpolated signal is N, each interpolator coupled to a corresponding IFFT transformer;
    separately performing, by M second filters, second filtering on the M interpolated signals to obtain M second filtered signals, each second filter coupled to a corresponding interpolator; and
    determining output signals according to the M second filtered signals.

5. The apparatus according to claim 4, wherein a frequency band of each filtered signal of the M first filtered signals occupies 1/M of a frequency band of the input signal.

6. The apparatus according to claim 4, wherein a quantity of sampling points of each extracted signal is N/M.

7. A non-transitory computer readable storage medium, comprising an instruction, wherein when the instruction runs on a computer, the instruction causes the computer to:
    perform M-way first filtering, by M first filters, on an input signal to decompose the input signal into M first filtered signals, wherein the input signal is a time-domain signal with N sampling points, frequency bands of the M first filtered signals do not overlap with each other, M is an integer greater than or equal to 2, and N is a positive integer;
    separately perform, by M extractors, extraction on the M first filtered signals to obtain M extracted signals, wherein a sum of sampling points of the M extracted signals is N, each extractor coupled to a corresponding first filter;
    separately perform, by M fast Fourier transform (FFT) transformers, fast Fourier transform (FFT) on the M extracted signals to obtain M frequency-domain signals, each FFT tranformer coupled to a corresponding extractor;

separately perform, by frequency-domain processers, frequency-domain processing on the M frequency-domain signals to obtain M frequency-domain processed signals, the frequency-domain processors coupled to the FFT transformers;

separately perform, by M inverse fast Fourier transform (IFFT) transformers, inverse fast Fourier transform (IFFT) on the M frequency-domain processed signals to obtain M time-domain signals, the IFFT transformers coupled to the frequency-domain processors;

separately perform, by M interpolators, interpolation on the M time-domain signals to obtain M interpolated signals, wherein a quantity of sampling points of each interpolated signal is N, each interpolator coupled to a corresponding IFFT transformer; and separately perform, by M second filters, second filtering on the M interpolated signals to obtain M second filtered signals, each second filter coupled to a corresponding interpolator; and determine output signals according to the M second filtered signals.

8. The non-transitory computer readable storage medium according to claim 7, wherein a frequency band of each filtered signal of the M first filtered signals occupies 1/M of a frequency band of the input signal.

9. The non-transitory computer readable storage medium according to claim 7, wherein a quantity of sampling points of each extracted signal is N/M.

\* \* \* \* \*

UNITED STATES PATENT AND TRADEMARK OFFICE
CERTIFICATE OF CORRECTION

PATENT NO. : 10,826,464 B2
APPLICATION NO. : 15/650619
DATED : November 3, 2020
INVENTOR(S) : Liang Zhuang Page 1 of 1

It is certified that error appears in the above-identified patent and that said Letters Patent is hereby corrected as shown below:

In the Claims

In Column 27, Line 39, Claim 1, delete "each FFT tranformer" and insert --each FFT transformer--.

In Column 27, Line 41, Claim 1, delete "by frequency-domain processers" and insert --by frequency-domain processors--.

In Column 28, Line 20, Claim 4, delete "each FFT tranformer" and insert --each FFT transformer--.

In Column 28, Line 22, Claim 4, delete "by frequency-domain processers" and insert --by frequency-domain processors--.

In Column 28, Line 66, Claim 7, delete "each FFT tranformer" and insert --each FFT transformer--.

In Column 29, Line 1, Claim 7, delete "by frequency-domain processers" and insert --by frequency-domain processors--.

Signed and Sealed this
Thirtieth Day of March, 2021

Drew Hirshfeld
*Performing the Functions and Duties of the
Under Secretary of Commerce for Intellectual Property and
Director of the United States Patent and Trademark Office*